(12) United States Patent
Chan et al.

(10) Patent No.: US 7,913,216 B2
(45) Date of Patent: Mar. 22, 2011

(54) ACCURATE PARASITICS ESTIMATION FOR HIERARCHICAL CUSTOMIZED VLSI DESIGN

(75) Inventors: Yiu-Hing Chan, Poughkeepsie, NY (US); Ronald Dennis Rose, Essex Junction, VT (US); Jun Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 511 days.

(21) Appl. No.: 12/032,643

(22) Filed: Feb. 16, 2008

(65) Prior Publication Data

US 2009/0210849 A1    Aug. 20, 2009

(51) Int. Cl.
*G06F 17/50* (2006.01)
(52) U.S. Cl. .......... 716/119; 716/125; 716/126
(58) Field of Classification Search .......... 716/7, 13, 716/14
See application file for complete search history.

(56) References Cited

U.S. PATENT DOCUMENTS

| | | | |
|---|---|---|---|
| 5,359,534 A | | 10/1994 | Fujiki et al. |
| 5,473,546 A | * | 12/1995 | Filseth ............................. 716/8 |
| 5,544,088 A | * | 8/1996 | Aubertine et al. .............. 716/13 |
| 5,629,860 A | | 5/1997 | Jones et al. |
| 6,072,945 A | | 6/2000 | Aji et al. |
| 6,086,238 A | | 7/2000 | Mehrotra et al. |
| 6,363,516 B1 | | 3/2002 | Cano et al. |
| 6,463,571 B1 | | 10/2002 | Morgan |
| 6,487,705 B1 | | 11/2002 | Roethig et al. |
| 6,526,549 B1 | | 2/2003 | You |
| 6,622,291 B1 | | 9/2003 | Ginetti |
| 6,704,697 B1 | | 3/2004 | Berevoescu et al. |
| 2006/0143589 A1 | | 6/2006 | Horng et al. |
| 2006/0190898 A1 | | 8/2006 | Kanamoto et al. |
| 2006/0190900 A1 | | 8/2006 | Chan et al. |
| 2009/0288054 A1 | * | 11/2009 | Okamoto ........................ 716/10 |

FOREIGN PATENT DOCUMENTS

JP         2006031542 A      2/2006

OTHER PUBLICATIONS

Shi et al, "A Fast Hierarchical Algorithm for Three-Dimensional Capacitance Extraction", IEEE Transactions on Computer-Aided Design of Integrated Circuits and Systems, vol. 21, No. 3, pp. 330-336, Mar. 2002.

* cited by examiner

*Primary Examiner* — Phallaka Kik
(74) *Attorney, Agent, or Firm* — William A. Kinnaman, Jr.

(57) ABSTRACT

Disclosed is a method of estimating interconnect wire parasitics in integrated circuits which includes obtaining a circuit layout having circuit components placed thereon including source input/output (I/O) pins and sink I/O pins, the circuit layout having a circuit hierarchy, bubbling up of the I/O pins until all I/O pins are on a same level of the circuit hierarchy, and then estimating interconnect segments to be employed in interconnecting at least some circuit components of the placed circuit components of the circuit layout. Also disclosed is a circuit design system and program storage device.

10 Claims, 10 Drawing Sheets

ACCURATE PARASITICS ESTIMATION FOR HIERARCHICAL CUSTOMIZED VLSI DESIGN

BACKGROUND OF THE INVENTION

This invention relates in general to the design, and automation thereof, of high-performance digital integrated circuits and in particular to the problem of accurate early estimation of circuit parasitics for hierarchical custom VLSI circuits.

In custom VLSI circuit design, the interconnect parasitic (either wire or via) between circuits in a design is typically manually measured or estimated based on a drawn floorplan of the design. These interconnect parasitic elements are then manually annotated onto the schematic. The schematic with the estimated interconnect parasitics is then analyzed through timing tools for timing and area optimization. The process requires significant manual effort on the part of the designer in measuring and estimating wire lengths between circuits in the design and then annotating the schematic with these parasitic elements. The accuracy and completeness of the estimated interconnect lengths between circuits depends upon the experience of the designer and can vary significantly within a large VLSI design team. Because of the time required, typically only a critical portion of the interconnect lengths are estimated, and thus, the timing of the design will not be known with a high degree of confidence until the circuit layout is completely routed and extracted timing is performed.

Chan et al. U.S. Patent Application US 2006/0190900, the disclosure of which is incorporated by reference herein, discloses a circuit design technique for automatically estimating lengths of interconnect segments to be employed in interconnecting at least some circuit components of a plurality of placed circuit components of a circuit layout. A route estimator, such as Steiner estimation, is employed to estimate lengths of the interconnect segments based on the pin locations of a plurality of pins.

In the hierarchical circuit design flow, the traditional Steiner estimation typically tends to be pessimistic for nets that cross hierarchy, i.e., input/output (I/O) nets in all levels of the hierarchy below the top level. Pessimistic in this context means that the Steiner estimation overestimates the length of wiring due to, for example, redundant wiring interconnect segments. A typical method to avoid pessimistic parasitic estimation in a hierarchical design is to flatten the entire design into a single level which destroys the hierarchy and can be difficult for the designer to debug in case of a problem.

BRIEF SUMMARY OF THE INVENTION

The advantages of the invention have been achieved by providing, according to a first aspect of the invention, a method of estimating interconnect wire parasitics in integrated circuits comprising the steps of:

obtaining a circuit layout having a plurality of circuit components placed thereon including a plurality of source input/output (I/O) pins and sink I/O pins, the circuit layout having a circuit hierarchy;

bubbling up of I/O pins until all I/O pins are on a same level of the circuit hierarchy; and estimating interconnect segments to be employed in interconnecting at least some circuit components of the plurality of placed circuit components of the circuit layout.

According to a second aspect of the invention, there is provided a circuit design system comprising:

means for obtaining a circuit layout having a plurality of circuit components placed thereon including a plurality of source input/output (I/O) pins and sink I/O pins, the circuit layout having a circuit hierarchy;

means for bubbling up of I/O pins until all I/O pins are on a same level of the circuit hierarchy; and means for estimating interconnect segments to be employed in interconnecting at least some circuit components of the plurality of placed circuit components of the circuit layout.

According to a third aspect of the invention, there is provided a program storage device readable by a machine embodying at least one program of instructions executable by the machine to perform a circuit design method, the method comprising:

obtaining a circuit layout having a plurality of circuit components placed thereon including a plurality of source input/output (I/O) pins and sink I/O pins, the circuit layout having a circuit hierarchy;

bubbling up of I/O pins until all I/O pins are on a same level of the circuit hierarchy; and estimating interconnect segments to be employed in interconnecting at least some circuit components of the plurality of placed circuit components of the circuit layout.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Before describing various aspects of the present invention in greater detail, the following definitions are provided to facilitate an understanding of the present invention:

Schematic—electrical drawing of a circuit.

Floorplan—a graphical drawing which indicates location, size and form factor of certain objects within a certain level of a VLSI circuit hierarchy. A floorplan is a precursor to a layout.

Default Interconnect—interconnect with electrical and physical properties that maximize the number of wiring tracks in each wiring layer in the chip yet satisfy the RC delay and coupling noise requirements of a large percentage of the connections/nets in the chip for a given VLSI semi-conductor process. They usually have minimum width and minimum spacing and large RC parasitic delay for long or heavily loaded interconnects/nets.

Net Attributes for Default Interconnect—the values of the electrical and physical properties of default interconnect/wiring of a given circuit design.

Non-Default Interconnect—specially selected electrical and/or physical properties of certain interconnect/wiring of a circuit. For example, critical wiring paths may have a larger interconnect width, greater interconnect spacing, a metal level with lower resistivity, and/or more shielding than default interconnects in order to reduce the parasitic RC delay of those interconnects.

Net Attributes for Non-Default Interconnect—the values of the electrical and physical properties for non-default interconnect/wiring of a given circuit design.

Circuit Layout—a graphical drawing which indicates location, size and form factors of objects, and contains connectivity and detailed shapes of the objects and interconnect routes between the objects. The detailed shapes of the objects represent different manufacturing levels of the semiconductor process, i.e., polygate, metal layers for interconnecting objects, P+ diffusion area of a transistor, N+ diffusion area of a transistor, etc. A completely placed, routed and checked circuit layout is used for manufacturing of the VLSI circuit/chip.

Placed Circuit Components—components or objects of the circuit which are placed in the graphical circuit layout drawing and from which the facility of the present invention estimates pin locations, interconnect segment lengths, and resistance capacitance interconnect parasitics.

Netlist—a text description of the connections between pins of two or more components in a VLSI circuit/chip. These pins/components can be from different levels of the VLSI chip hierarchy. Each connection has a unique name associated with it. The netlist includes component instantiations and occasionally the electrical and physical property information of their connections.

Steiner Route Estimator—a facility for estimating length of an interconnect segment employing a Steiner tree/graph/route estimation. Steiner estimation is described in greater detail in various publications.

Parasitic RC Model—a resistance capacitance model with specific values, determined in accordance with an aspect of the present invention, by a formula employing at least some of the interconnect segment lengths, interconnect spacings, interconnect widths, metal level of the interconnects and neighbor hostility factors. For example, the formula may be based on the geometry of the interconnect, the interconnects's left, right, top and bottom neighbors' geometry, the interconnects' left and right neighbor switching conditions, material of the interconnect and dielectric material between the metal levels.

VLSI Circuit Hierarchy—a very large scale integrated (VLSI) circuit hierarchy comprises various levels of functional circuit units. As one example, a VLSI circuit may comprise units, with each unit comprising macros. A macro may comprise one or more sub-macros, and a sub-macro one or more gate/cells. A gate/cell may comprise one or more transistors/devices which may be drawn and shown in a layout or schematic. There are input/output pins associated with each level of the hierarchy. Examples of a VLSI circuit include a microprocessor, DRAM, DSP. Examples of units include a floating point unit, and an instruction fetch unit. Examples of macros include a 32-bit parallel adder, and a 32-bit register. Examples of sub-macros include clock drivers, latches, and 4-bit ripple carry adders. Examples of gates/cells are 2 input NAND and 3 input NOR devices, etc.

Figure 1:
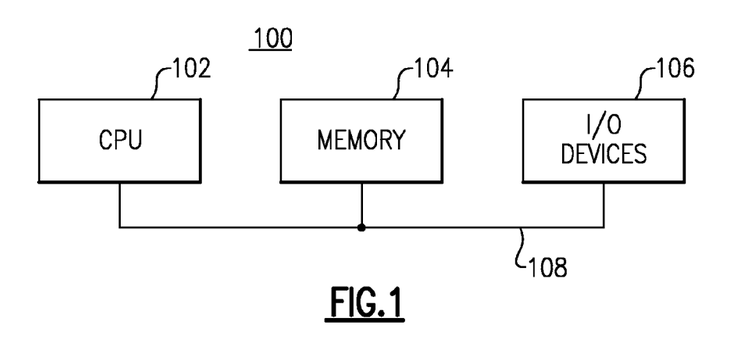
FIG. 1 illustrates one example of a computing environment to incorporate and use one or more aspects of the present invention.

Referring now to the Figures in more detail and particularly referring to FIG. 1, one embodiment of a computing environment 100 to incorporate and use one or more aspects of the present invention is depicted in FIG. 1. This computing environment 100 includes, for instance, a central processing unit (CPU) 102, a memory 104 (e.g., main memory) and one or more input/output (I/O) devices 106 coupled to one another via, for example, one or more busses 108.

Those skilled in the art will note that the concepts disclosed herein are not restricted to a particular computing environment architecture and may be employed with any computing environment which supports the innovative functions described.

Figure 2:
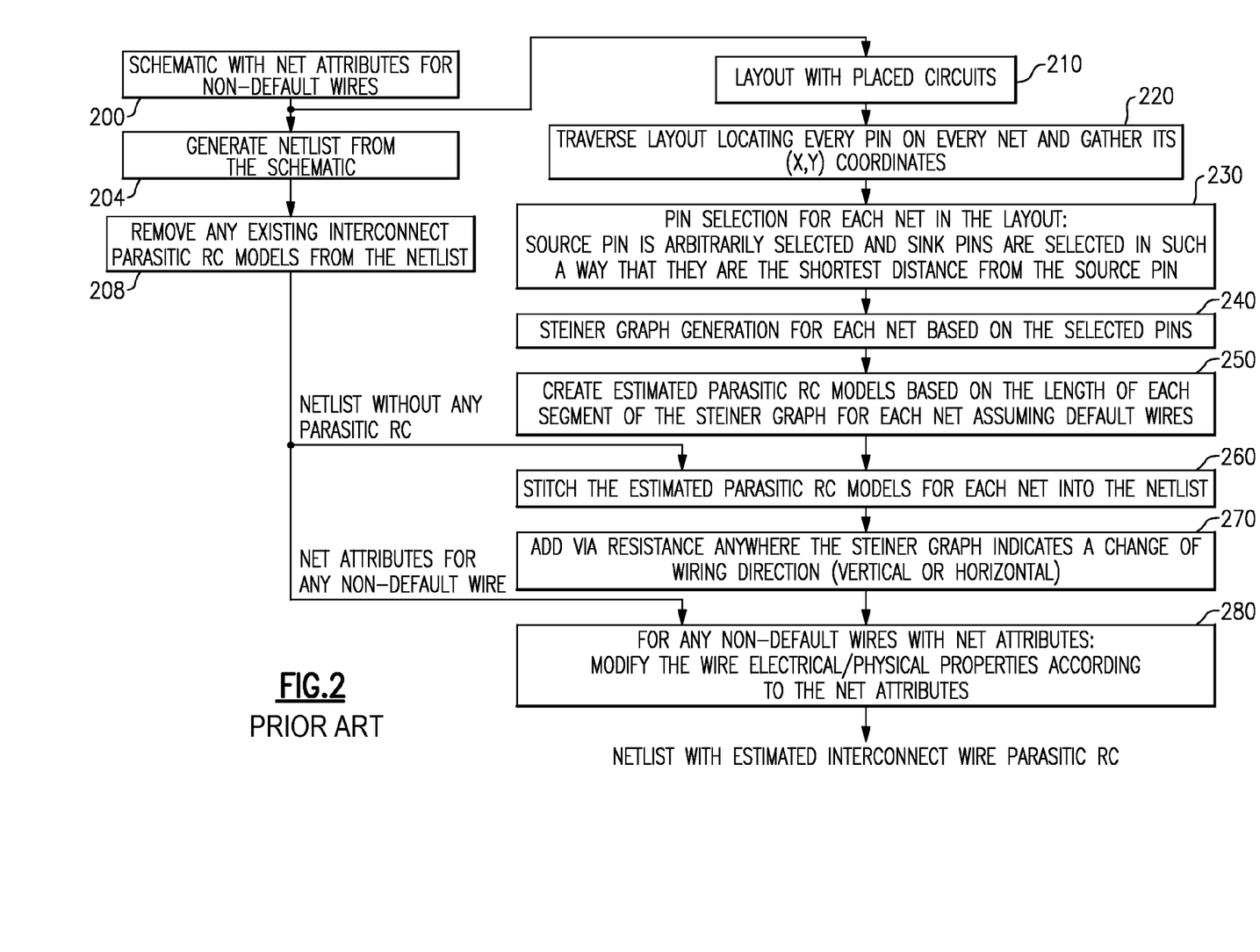
FIG. 2 is a flowchart of a conventional automated process for estimating resistance capacitance interconnect parasitics.

FIG. 2 depicts a flowchart of a conventional process or facility for automatically estimating resistance capacitance interconnect parasitic as disclosed in U.S. Patent Application US 2006/0190900 discussed above. This process assumes the existence of a circuit schematic which may have net attributes for non-default interconnects 200. A circuit layout with placed circuit components 210 is generated in the traditional manner during a conventional circuit design process. As one example, the circuit being designed may comprise a custom VLSI circuit. Generation of a circuit layout is described in the literature.

Processing begins by traversing the circuit layout locating a possible location of every pin on every net, and the X, Y coordinates thereof 220. Processing then automatically selects pin locations for each net in the layout 230. By way of example, this can be accomplished by locating a source pin (i.e., output pin) for the net, and then selecting sink pins (i.e., input pins) for each macro to be connected to the net. The sink pin of each macro is selected to be the pin location a shortest distance from the source pin. Any sub-macros within a given macro are assumed to be electrically connected together at a lower hierarchical level than the level currently under analysis. Further, the processing assumes that at a lower or lowest level of the hierarchy, pin locations are specified in the placed circuit layout for interconnecting components, such as a sub-macro within a given macro.

The generated pin locations of each net are then employed in a route estimator, such as a Steiner route estimator, to form a graph with point locations for a Steiner tree for each net based on the selected pins 240. The graph of the Steiner plot contains a list of coordinate pairs that describe wire segments in the Steiner tree. To map coordinates to instance terminals in a layout, an instance and pin name hash table is kept using the pin coordinates as a key. Each coordinate in the Steiner graph is checked in the hash table. If the coordinate does not correspond to a pin, it is a junction point. Junction points are recorded so that other wire segments may connect to them as described by the Steiner plot. The orientation of the wire segment in the Steiner plot is recorded so that a via is added on a junction where two segments of orthogonal direction intersect. This via reflects the change in metal layer required to switch metal directions between vertical and horizontal. When a wire RC parasitic model is created to represent a segment, it is connected to the two nets defined by their end coordinates, whether they be pin or junction points. Unique net names are built for these nets by concatenating the coordinates, type of junction, orientation, and original net name. The final netlist with Steiner estimated parasitics contains the wire RC models reflecting the Steiner segments, sub-macro blocks, and nets connecting the wire models and sub-macro blocks together.

The process next creates parasitic RC models for each interconnect segment based on the length of each segment in the Steiner graph for each net, and assuming default interconnects 250 unless otherwise defined by net attributes. Default interconnects are assumed since the delay and coupling noise requirements for a large percentage of the nets in the chip can be met with default interconnects. The net attributes in the schematic define, for example, metal level, interconnect width, interconnect spacing and neighbor hostility for a small number of nets, such as clock and timing critical nets that need non-default wires with small RC parasitic delay. The default wires in the circuit design are assumed to be a minimum width and minimum spacing for a given technology, and therefore have a higher RC parasitic delay for longer interconnects.

As further shown in FIG. 2, the conventional process also includes generating a netlist from the schematic 204, which can be readily accomplished by one skilled in the art using existing products. Any parasitic interconnect RC elements or models within the generated netlist are then removed 208. This allows the new parasitic interconnect RC models based on the Steiner estimated segment lengths to be stitched into the netlist 260. Further, when the route estimator indicates a change in the direction/wiring level in a net, a resistor via model is to be automatically inserted between the interconnect segments or interconnect RC parasitic models 270.

For any non-default interconnect with net attributes from the schematic, processing next modifies the electrical/physical properties of the corresponding estimated interconnect according to these non-default net attributes 280. For example, metal level, interconnect width and spacing may be modified according to the net attributes from the schematic for all non-default interconnects. All nets in the circuit layout with placed circuit components may be automatically estimated using the process of FIG. 2 to create a complete interconnect/via parasitic model of the circuit design. An output of the process can be an updated netlist with the estimated interconnects and the corresponding estimated parasitic RC models. This netlist is hierarchical in nature, wherein each netlist file reflects, in one example, one schematic macro view. The device/circuit connections and instantiations can finally be assembled according to the schematic with the updated netlist using the circuit layout.

Figure 3:
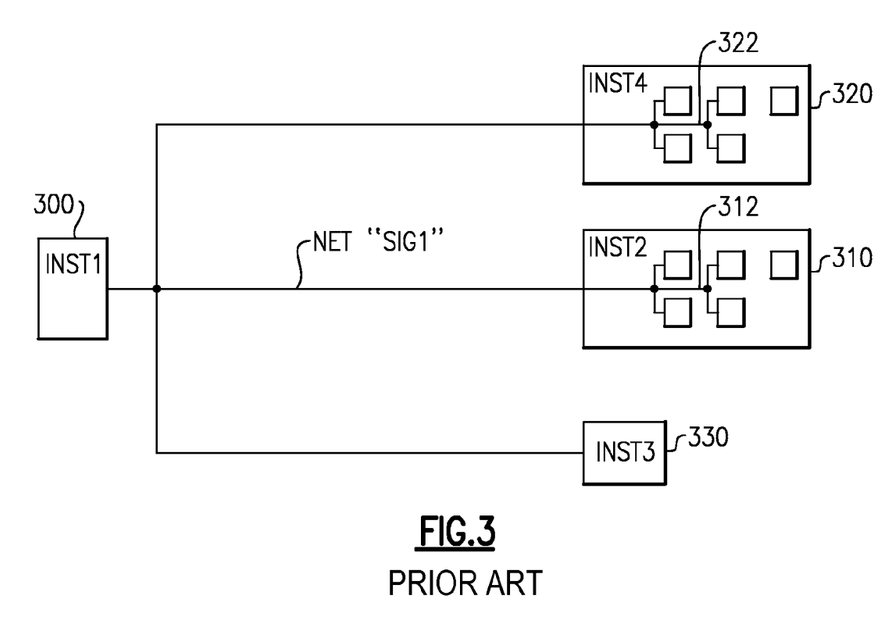
FIG. 3 illustrates one example of a net schematic showing net attributes for non-default interconnect, in accordance with the process of FIG. 2.

FIG. 3 depicts a net schematic with four instances 300, 310, 320, 330 of macros which are interconnected via a net labeled "sig 1". This net is assumed to comprise non-default interconnects. Instances 310, 320 show internal wiring nets 312, 322 connecting certain of the sub-macros in the instances 310, 320.

Figure 4:
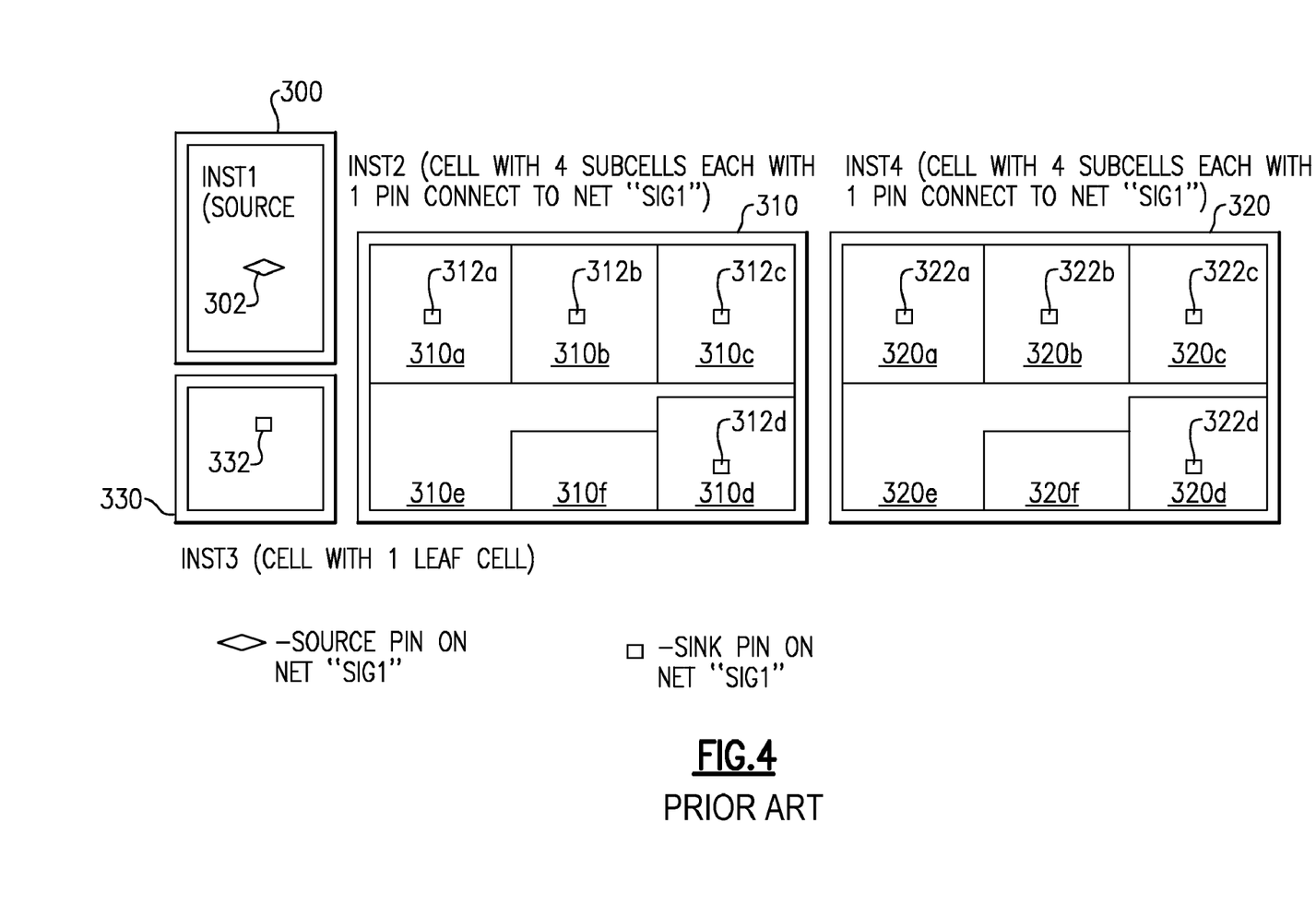
FIG. 4 illustrates one example of a circuit layout showing four simplified instances of functional macros and pin locations for each macro and sub-macro to be electrically interconnected via the net, in accordance with the process of FIG. 2.

FIG. 4 depicts one example of a circuit layout showing the four instances 300, 310, 320, 330 of macros. These instances are assumed to comprise placed components in the circuit layout. In this example, instance 1 300 and instance 3 330 are each assumed to comprise a single macro, while instance 2 310 comprises a plurality of sub-macros 310a-310f and instance 4 320 comprises a plurality of sub-macros 320a-320f of which only sub-macros 310a-310d and 320a-320d are to be electrically connected with instance 1 300 and instance 3 330 via net "sig 1". As shown, instance 1 300 is assumed to have one output or source pin 302 which connects to net "sig 1". The four sub-macros 310a-310d of instance 2 310 each have one input pin 312a-312d to be electrically connected to net "sig 1". Instance 3 is assumed to have one input pin 332 which is to connect to net "sig 1" while sub-macros 320a-320d of instance 4 320 each have one input pin 322a-322d to be electrically connected to net "sig 1". The netlist provided with the schematic defines a given pin as either an input pin or an output pin (i.e., either sink or source).

In accordance with the process of FIG. 2, the layout of FIG. 4 is traversed and every possible pin location is identified for net "sig 1", and X, Y coordinates (e.g., absolute values) are gathered for these pin locations. To facilitate this process, one of ordinary skill in the art can provide an automated facility to traverse the layout and gather these coordinates. Again, in the example of FIG. 4, there is one source pin 302 from instance 1 300 for net "sig 1", and nine sink pins for the net, i.e., four sink pins 312a-312d from instance 2 310, four sink pins 322a-322d from instance 4 320 and one sink pin 332 from instance 3 330.

Figure 5:
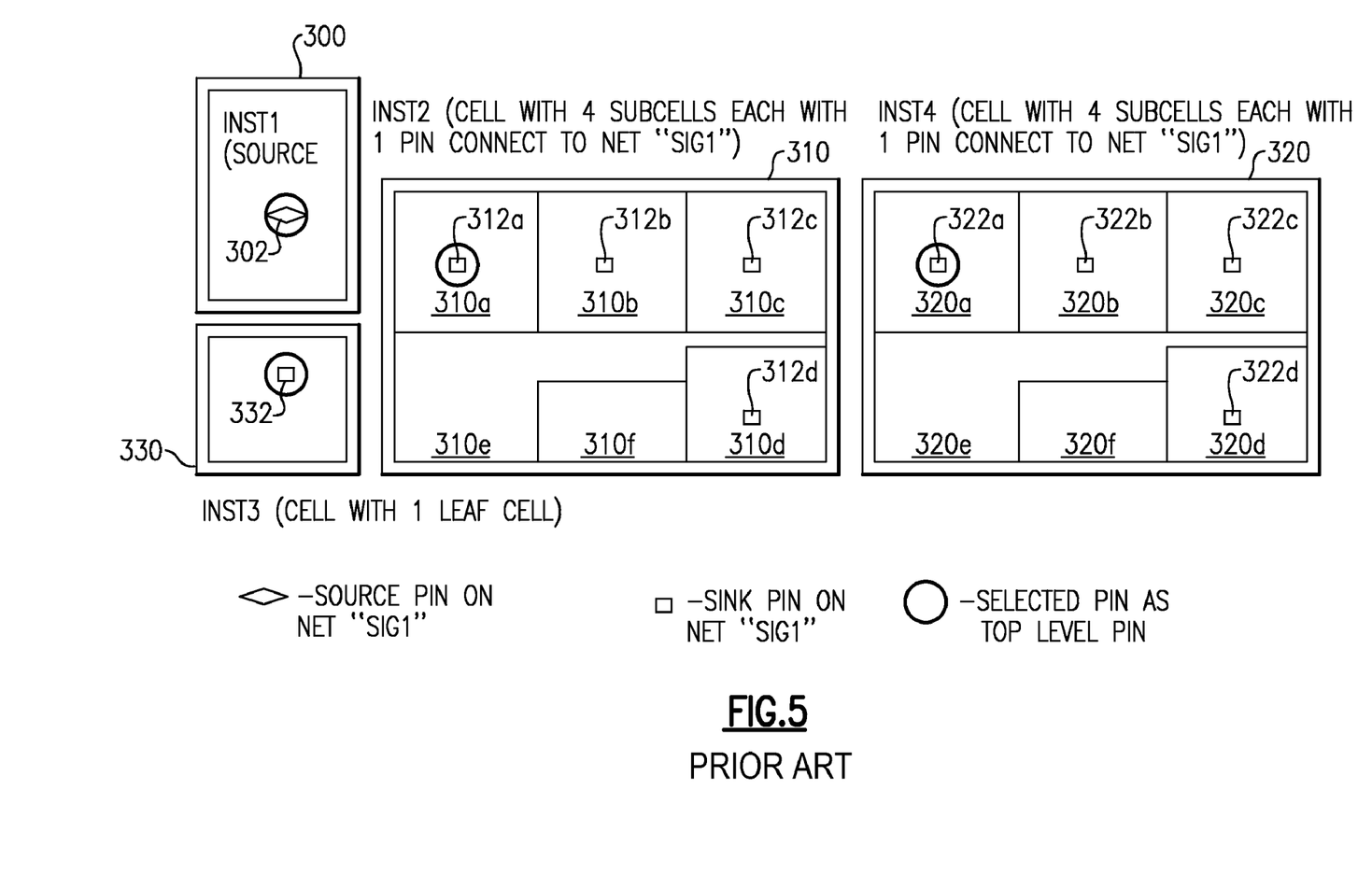
FIG. 5 illustrates the circuit layout of FIG. 4, showing automatically selected source and sink pin locations for the net, in accordance with the process of FIG. 2.

Referring to FIG. 5, after identifying the source and sink pins and their location, the process of FIG. 2 next selects one input/output pin per instance 300, 310, 320, 330 to be connected in the net. The source pin 302 is arbitrarily selected, and the sink pins are then selected according to their distance from the source pin 302. As one example, for each instance 310, 320, 330 the pin location closest to source pin 302 is to be automatically selected, which in this example, results in the selection of sink pin 312a of sub-macro 310a of instance 310, sink pin 322a of sub-macro 320a of instance 320 and pin 332 of instance 330. By selecting the sink pin location closest to the source, RC parasitic delays are minimized, thus enhancing timing. The process of FIGS. 3 to 5 is repeated automatically for each net to be employed in the circuit layout.

Figure 6:
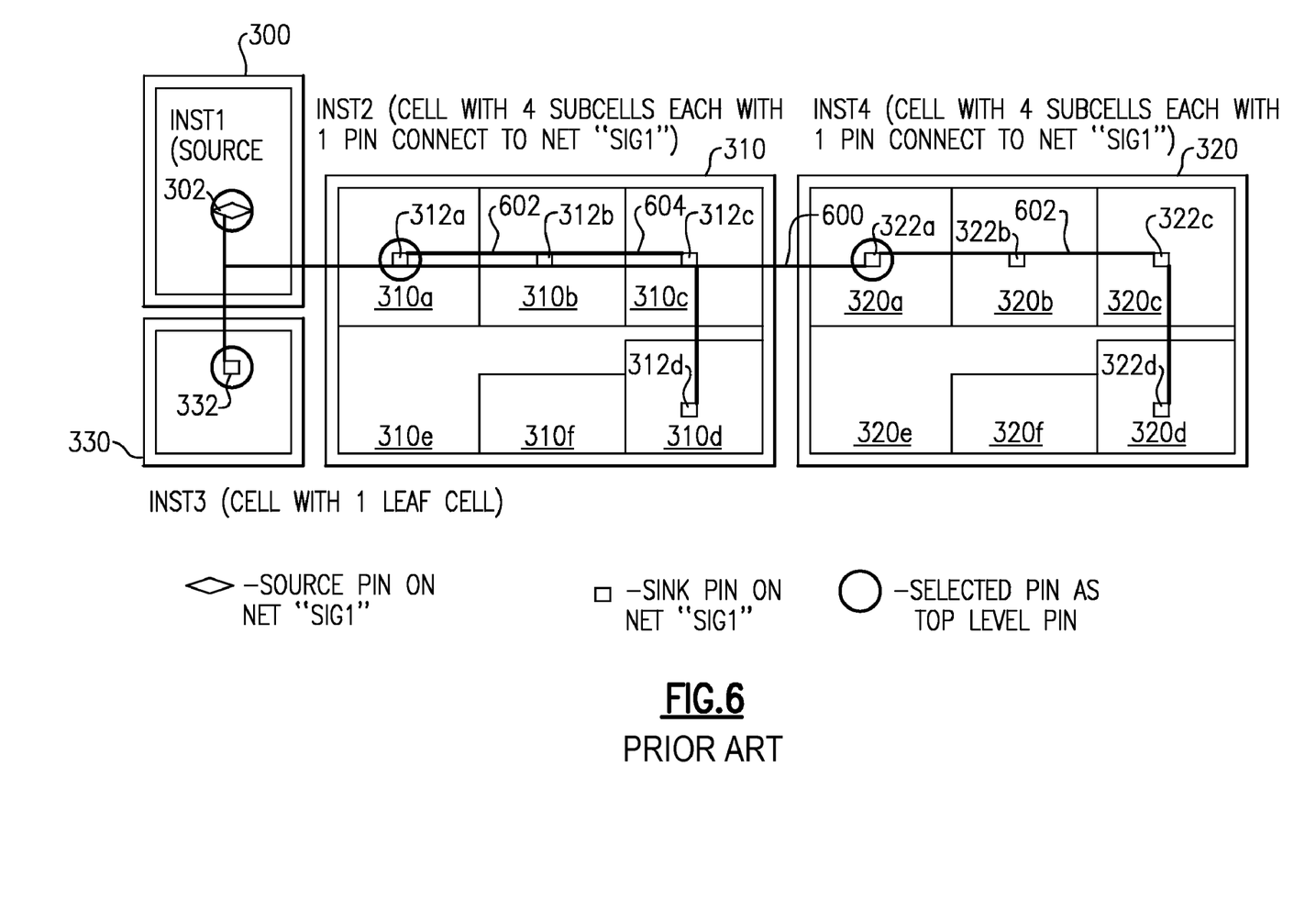
FIG. 6 illustrates the circuit layout of FIG. 5, showing a Steiner route graph for the net given the circuit layout of FIGS. 4 and 5, in accordance with the process of FIG. 2.

FIG. 6 depicts the creation of a Steiner graph 600 employing the selected pins for net "sig 1" of FIG. 5. The Steiner graph is generated for each net based on the selected pins. The Steiner graph connects pins 302, 332, 312a and 322a with interconnecting segments as shown in FIG. 6 for net "sig 1".

Also shown in FIG. 6 is a Steiner graph 602 for connecting the four sub-macro pins one level down inside instance 2 310 and instance 4 320. That is, Steiner segments connect pins 312a-312d and 322a-322d. The result of the Steiner estimation for the layout is pessimistic for the net configuration shown in FIG. 6 due to the presence of redundant Steiner segment 604.

The present invention is an improvement over the prior art in that the hierarchy of the design is preserved, thereby avoiding flattening, and accurate Steiner estimation is achieved. According to the present invention, the I/O pins are "bubbled up" along the hierarchy until the net topology is complete for Steiner estimation. The I/O pins are those pins which, with respect to a particular circuit component, connect to another circuit component on the same or a different level of the circuit hierarchy.

Figure 7:
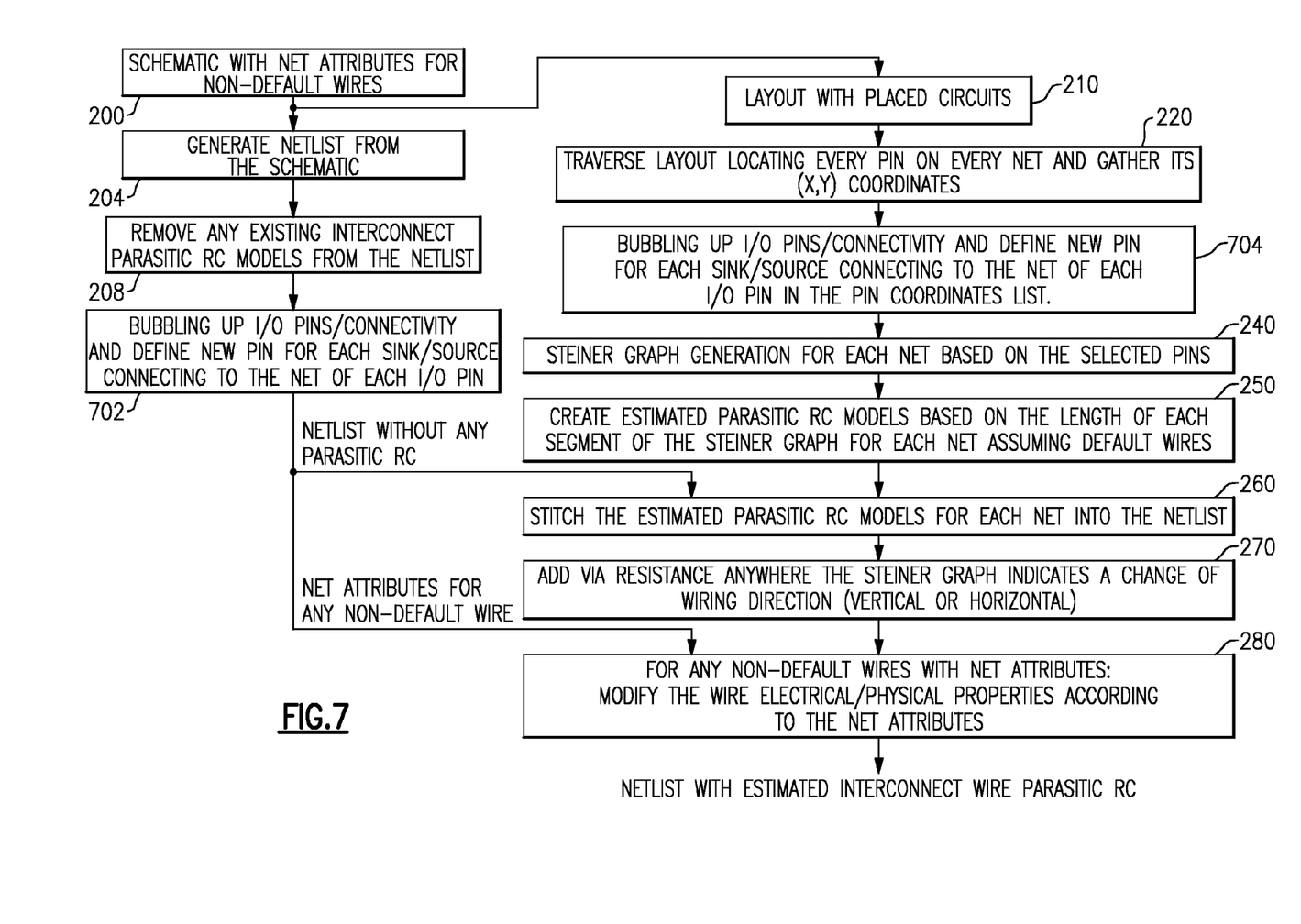
FIG. 7 is a flowchart of a process for estimating resistance capacitance interconnect parasitic according to the present invention.

Referring now to FIG. 7, a flowchart of the present invention is illustrated. The flowchart of FIG. 2 for conventional parasitics estimation is modified to show the improvement of the present invention wherein the I/O pins are bubbled up. On the schematic side of the flowchart, a schematic with net attributes for non-default wires 200 is obtained followed by generating the netlist from the schematic 204 and removing any existing interconnect parasitic RC models from the netlist 208. Then, according to the present invention, the next step is bubbling up I/O pins/connectivity and defining a new pin for each sink/source connecting to the net of each I/O pin 702.

On the layout side of the flowchart, a layout with placed circuits 210 is done followed by traverse layout locating every pin on every net and gather its (x,y) coordinates 220. At this point in the prior art, the step of pin selection would occur where the source pin is arbitrarily selected and sink pins are selected to be the shortest distance from the source pin. The present inventors have shown in FIG. 6 that this process step leads to pessimistic Steiner estimation due to redundant Steiner segment(s).

Still referring to FIG. 7, the present invention now includes the step of bubbling up I/O pins/connectivity and defining a new pin for each sink/source connecting to the net of each I/O pin in the pin coordinates list 704.

The remaining steps of the prior art continue as before, namely, Steiner graph generation for each net based on the selected pins 240, create estimated parasitic RC models based on the length of each segment of the Steiner graph for each net assuming default wires 250, stitch the estimated parasitic RC models for each net into the netlist 260, add via resistance anywhere the Steiner graph indicates a change of wiring direction 270 and for any non-default wires with net attributes: modify the wire electrical/physical properties according to the net attributes 280.

There are two strategies contemplated by the present inventors for bubbling up of the I/O pins. In the "bottom up" technique, the I/O pins are bubbled up the hierarchy until the net topology is complete. In the "top down" technique, the I/O pins are traversed down the hierarchy until gates/cells are reached. For purposes of illustration and not limitation, only the bottom up technique is described herein. The top down technique could be utilized to achieve the same results.

For bubbling up of I/O pins as to input pins, each sink that connects to the net of an input pin in the current level of the hierarchy is defined as an unique input pin. As an example, assume that input pin "IN" is connected to pin "a" in instance I, instance J, instance K and instance L. Then, the sink pins "a" in instance I, instance J, instance K and instance L are bubbled up as input pins and input pin "IN" is modified as four unique pins in the schematic net list and the pin coordinates list: "IN_I_a", "IN_J_a", "IN_K_a", and "IN_L_a" in the current level of the hierarchy. The connectivity for pins "IN_l_a", "IN_J_a", "IN_K_a", and "IN_L_a" are bubbled up to the next level of the hierarchy.

For bubbling up of I/O pins as to output pins, each source that connects to the net of an output pin in the current level of the hierarchy is defined as an unique output pin. As an example, assume output pin "O" is driven by source pin "y" in instance M and instance N. Then source pin "y" in instance M and instance N are bubbled up as output pins and output pin "O" is modified as two unique pins in the schematic netlist and the pin coordinates list: "O_M_y" and "O_N_y" in the current level of the hierarchy. The connectivity for pins "O_M_y" and "O_N_y" are bubbled up to the next level of the hierarchy.

Figure 8A:
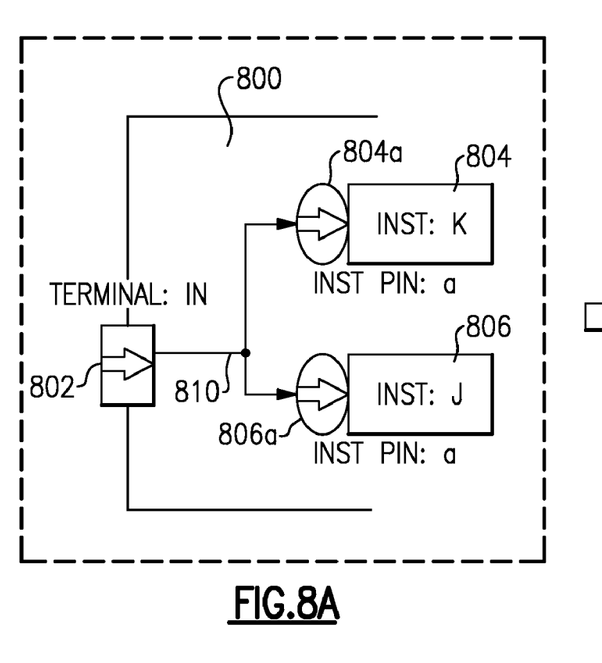
FIGS. 8A and 8B illustrate the bubbling up of an input I/O pin in a circuit schematic.
Figure 8B:
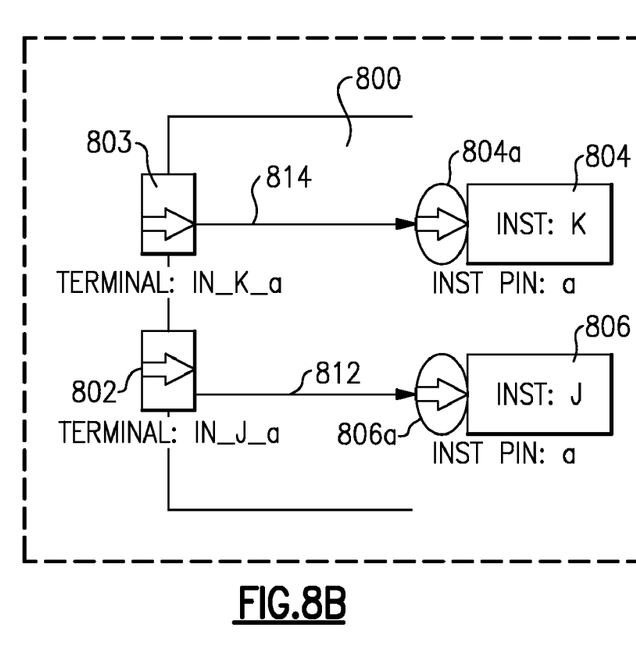

Referring now to FIGS. 8A and 8B, there is illustrated the bubbling up of an input pin in a schematic. Macro 800 has an input I/O pin "IN" 802 which is connected by internal wiring net 810 to sub-macro instance K 804 by pin 804a and to sub-macro instance J 806 by pin 806a. In the present invention the schematic is modified as shown in FIG. 8B. The I/O pins are bubbled up as two unique pins up so that I/O pin IN_J_a 802 is connected by internal wiring net 812 to sub-macro instance J 806 by pin 806a while I/O pin IN_K_a 803 is connected by internal wiring net 814 to sub-macro instance K 804 by pin 804a.

Figure 9A:
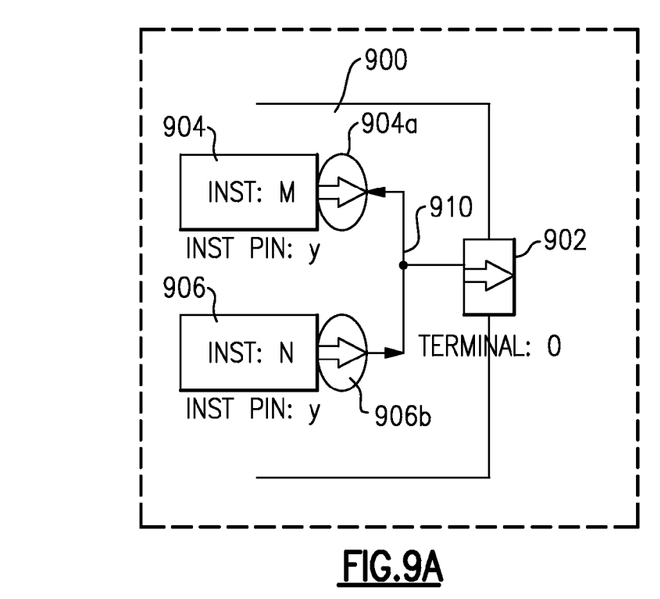
FIGS. 9A and 9B illustrate the bubbling up of an output I/O pin in a circuit schematic.
Figure 9B:
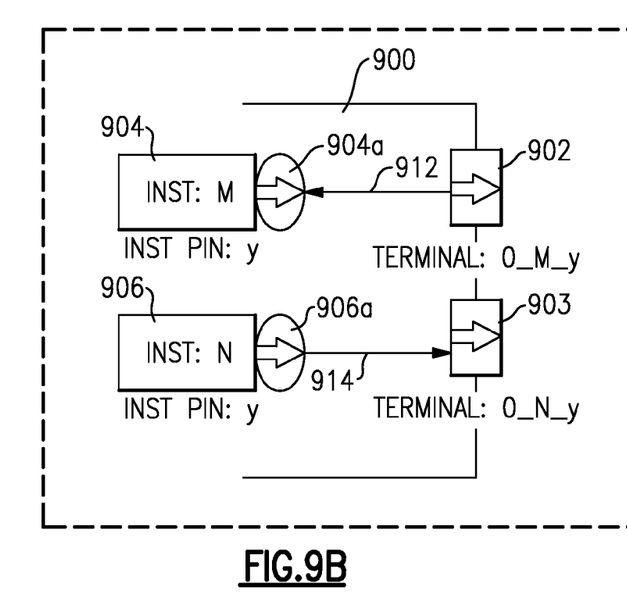

In FIGS. 9A and 9B, there is illustrated the bubbling up of an output pin "O" in a schematic. As shown in FIG. 9A, macro 900 has sub-macros instances M 904, N 906 connected through pins 904a, 906a to I/O pin O 902 through internal wiring net 910. When the output pin O 902 is bubbled up, then as shown in FIG. 9B, sub-macro instance M 904 having pin 904a is directly connected to I/O pin O_M_y 902 by internal wiring net 912. And sub-macro instance N 906 having pin 906a is directly connected to I/O pin O_N_y 903 by internal wiring net 914.

Figure 10:
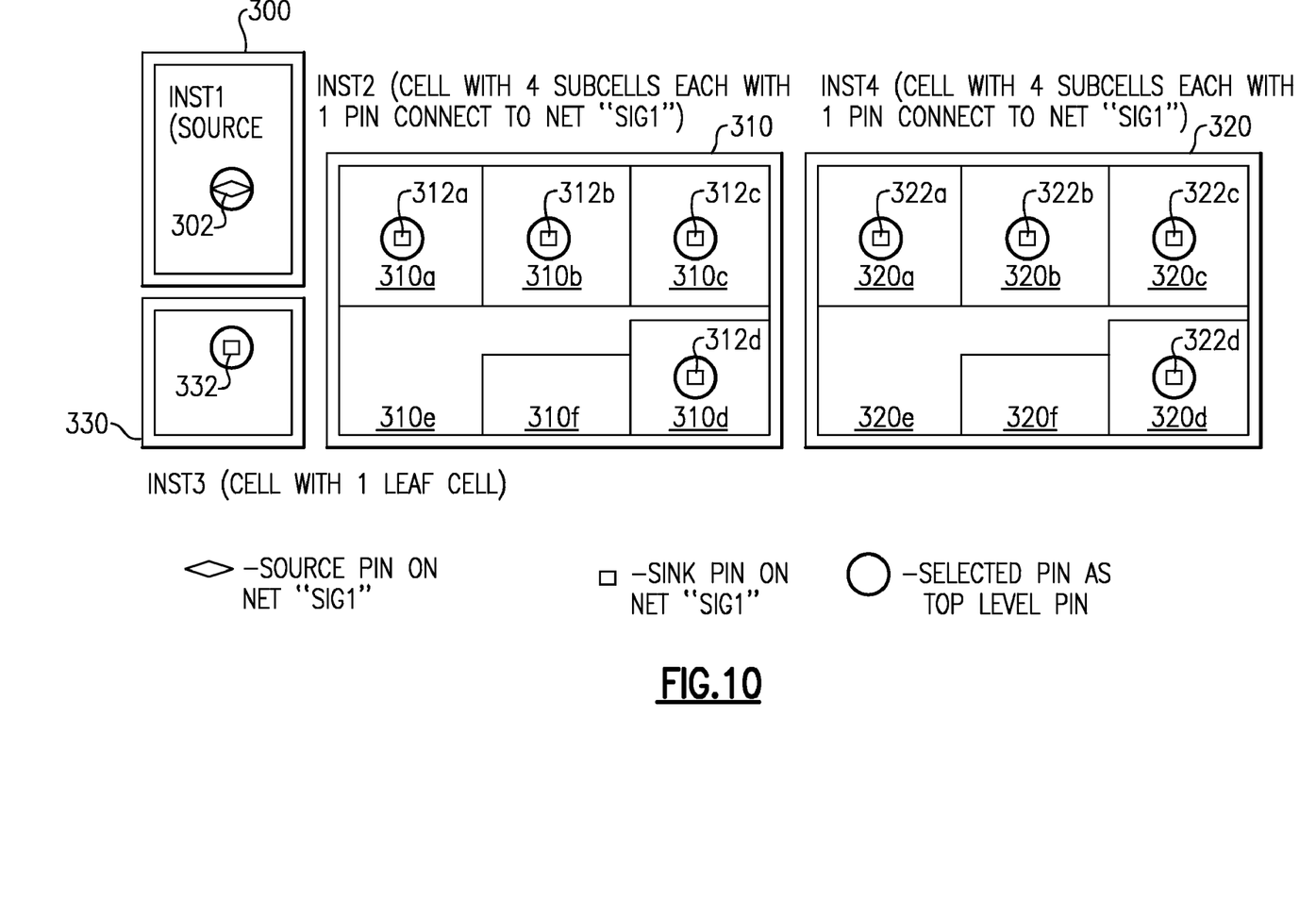
FIG. 10 is a circuit layout similar to FIGS. 4 and 5 but with all source and sink pin locations selected according to the present invention.

The layout of FIG. 5 has been remapped in FIG. 10 to show the effect of bubbling up of the I/O pins. In FIG. 10, there are four instances 300, 310, 320, 330 of macros. As before, instance 1 300 and instance 3 330 are each assumed to comprise a single macro, while instance 2 310 comprises a plurality of sub-macros 310a-310f and instance 4 320 comprises a plurality of sub-macros 320a-320f of which only sub-macros 310a-310d and 320a-320d are to be electrically connected with instance 1 300 and instance 3 330 via net "sig 1". As shown, instance 1 300 is assumed to have one output or source pin 302 which connects to net "sig 1". The four sub-macros 310a-310d of instance 2 310 each have one input pin 312a-312d to be electrically connected to net "sig 1". Instance 3 is assumed to have one input pin 332 which is to connect to net "sig 1" while sub-macros 320a-320d of instance 4 320 each have one input pin 322a-322d to be electrically connected to net "sig 1".

In accordance with the process of FIG. 7, the layout of FIG. 10 is traversed and every possible pin location is identified for net "sig 1", and X, Y coordinates are gathered for these pin locations. Thus, there is one source pin 302 for instance 1 300 and nine sink pins for the net comprised of four sink pins 312a-312d from instance 2 310, four sink pins 322a-322d from instance 4 320 and one sink pin 332 from instance 3 330.

There must be corresponding pins between the schematic net list and the pin coordinates list. Each of the four pins for net "sig 1" in instance 2 310 (pins 312a-312d) and instance 4 320 (pins 322a-322d) have unique names in the schematic netlist and the pin coordinates list due to pin bubbling. All such pins are selected, so indicated with a circle around the pin. The net "sig 1" now has ten pins with connectivity in the top level schematic and placed layout.

Figure 11:
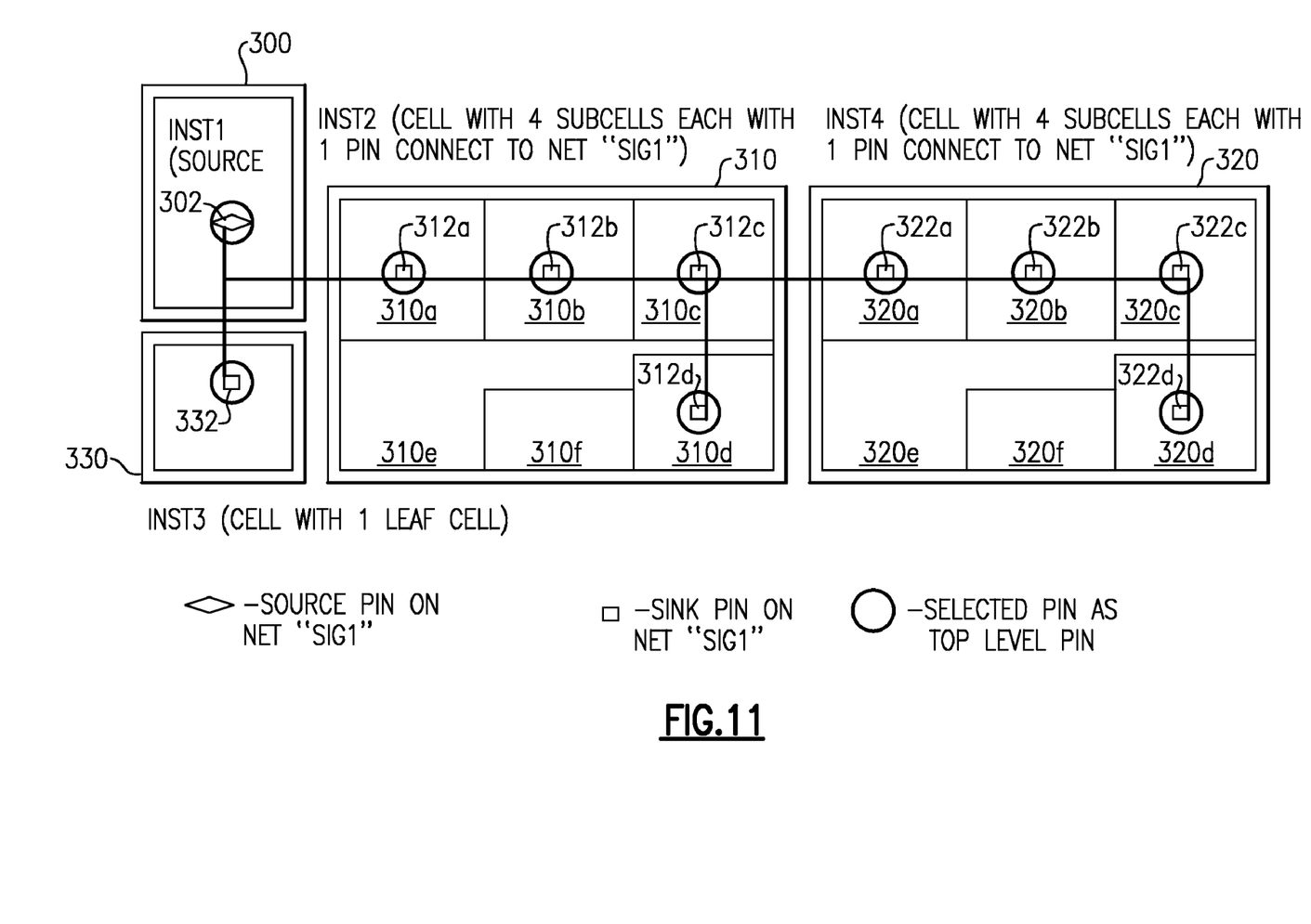
FIG. 11 is a circuit layout of FIG. 10, showing a Steiner route graph for the net "sig 1" given the circuit layout of FIG. 10, in accordance with the process of FIG. 7 according to the present invention.

Referring simultaneously to FIGS. 7 and 11, a new Steiner graph 1100 has been generated for net "sig 1" based on the selected pins from FIG. 10. As can be seen, the Steiner graph connects source pin 302 and sink pins 312a-312d, 322a-322d and 332. The result is an accurate Steiner estimation for nets across the hierarchy without the redundancy that leads to pessimism.

The present invention, which does not cause flattening of the hierarchy, has particular advantages over those techniques for parasitics estimation which cause flattening of the hierarchy. Flattening of the hierarchy cannot reuse Steiner estimation of sub-macros while the present invention can since the hierarchy is preserved. Further, flattening is typically hard for the designer to debug while the present invention preserves the hierarchy information in the new bubbled up pin names.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method of estimating interconnect wire parasitics in integrated circuits comprising the steps of:
   obtaining a circuit layout having a plurality of circuit components placed thereon including a plurality of source input/output (I/O) pins and sink I/O pins, the circuit layout having a circuit hierarchy;
   bubbling up of I/O pins until all I/O pins are on a same level of the circuit hierarchy, wherein bubbling up of I/O pins comprises:
   traversing the layout locating I/O pins on every net;
   determining a first I/O pin on a first level of the circuit hierarchy;
   determining all second I/O pins on a second level of the circuit hierarchy that electrically, connect to the first I/O pin:
   modifying the first I/O pin to be a plurality of first I/O pins equal to the number of second I/O pins; and
   moving the second I/O pins to the first level of the circuit hierarchy so that the second I/O pins and their connectivity to the first I/O pins are on the first level of the circuit hierarchy; and
   estimating by a computer processor interconnect segments to be employed in interconnecting at least some circuit components of the plurality of placed circuit components of the circuit layout.

2. The method of claim 1 wherein the first I/O pins are input pins and the second I/O pins are sink pins.

3. The method of claim 1 wherein the first I/O pins are output pins and the second I/O pins are source pins.

4. The method of claim 1 further including the steps of:
   obtaining a circuit schematic including a plurality of source I/O pins and sink I/O pins;
   generating a netlist from the schematic; and
   bubbling up of the I/O pins in the netlist until all I/O pins are on a same level of the circuit hierarchy, wherein bubbling up of the I/O pins in the netlist comprises:
   determining a first I/O pin on a first level of the circuit hierarchy;
   determining all second I/O pins on a second level of the circuit hierarchy that electrically connect to the first I/O pin;
   modifying the first I/O pin to be a plurality of first I/O pins equal to the number of second I/O pins; and
   moving the second I/O pins to the first level of the circuit hierarchy so that the second I/O pins and their connectivity to the first I/O pins are on the first level of the circuit hierarchy.

5. The method of claim 4 wherein the first I/O pins are input pins and the second I/O pins are sink pins.

6. The method of claim 4 wherein the first I/O pins are output pins and the second I/O pins are source pins.

7. A circuit design system comprising:
   means for obtaining a circuit layout having a plurality of circuit components placed thereon including a plurality of source input/output (I/O) pins and sink I/O pins, the circuit layout having a circuit hierarchy;
   means for bubbling up of I/O pins until all I/O pins are on a same level of the circuit hierarchy, wherein the means for bubbling up comprises:
   means for traversing the layout locating I/O pins on every net;
   means for determining a first I/O pin on a first level of the circuit hierarchy;
   means for determining all second I/O pins on a second level of the circuit hierarchy that electrically connect to the first I/O pin;
   means for modifying the first I/O pin to be a plurality of first I/O pins equal to the number of second I/O pins; and
   means for moving the second I/O pins to the first level of the circuit hierarchy so that the second I/O pins and their connectivity to the first I/O pins are on the first level of the circuit hierarchy; and
   means for estimating interconnect segments to be employed in interconnecting at least some circuit components of the plurality of placed circuit components of the circuit layout.

8. The circuit design system of claim 7 further comprising:
   means for obtaining a circuit schematic including a plurality of source I/O pins and sink I/O pins;
   means for generating a netlist from the schematic; and
   means for bubbling up of the I/O pins in the netlist until all I/O pins are on a same level of the circuit hierarchy, wherein the means for bubbling up in the netlist comprises:
   means for determining a first I/O pin on a first level of the circuit hierarchy;
   means for determining all second I/O pins on a second level of the circuit hierarchy that electrically connect to the first I/O pin;
   means for modifying the first I/O pin to be a plurality of first I/O pins equal to the number of second I/O pins; and
   means for moving the second I/O pins to the first level of the circuit hierarchy so that the second I/O pins and their connectivity to the first I/O pins are on the first level of the circuit hierarchy.

9. A program storage device readable by a machine embodying at least one program of instructions executable by the machine to perform a circuit design method, the method comprising:
   obtaining a circuit layout having a plurality of circuit components placed thereon including a plurality of source input/output (I/O) pins and sink I/O pins, the circuit layout having a circuit hierarchy;
   bubbling up of I/O pins until all I/O pins are on a same level of the circuit hierarchy, wherein bubbling up of I/O pins comprises:
   traversing the layout locating I/O pins on every net;
   determining a first I/O pin on a first level of the circuit hierarchy;
   determining all second I/O pins on a second level of the circuit hierarchy that electrically connect to the first I/O pin;
   modifying the first I/O pin to be a plurality of first I/O pins equal to the number of second I/O pins; and
   moving the second I/O pins to the first level of the circuit hierarchy so that the second I/O pins and their connectivity to the first I/O pins are on the first level of the circuit hierarchy; and
   estimating interconnect segments to be employed in interconnecting at least some circuit components of the plurality of placed circuit components of the circuit layout.

10. The program storage device of claim 9 further including the steps of:
    obtaining a circuit schematic including a plurality of source I/O pins and sink I/O pins;
    generating a netlist from the schematic; and bubbling up of the I/O pins in the netlist until all I/O pins are on a same level of the circuit hierarchy, wherein bubbling up in the netlist comprises:
  determining a first I/O pin on a first level of the circuit hierarchy;
  determining all second I/O pins on a second level of the circuit hierarchy that electrically connect to the first I/O pin;
  modifying the first I/O pin to be a plurality of first I/O pins equal to the number of second I/O pins; and
  moving the second I/O pins to the first level of the circuit hierarchy so that the second I/O pins and their connectivity to the first I/O pins are on the first level of the circuit hierarchy.

* * * * *